(12) United States Patent
Tong

(10) Patent No.: US 12,125,683 B2
(45) Date of Patent: Oct. 22, 2024

(54) METHOD TO IMPROVE WAFER EDGE UNIFORMITY

(71) Applicant: Applied Materials, Inc., Santa Clara, CA (US)

(72) Inventor: Mingle Tong, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 568 days.

(21) Appl. No.: 17/324,435

(22) Filed: May 19, 2021

(65) Prior Publication Data
US 2022/0375727 A1    Nov. 24, 2022

(51) Int. Cl.
*H01J 37/32*     (2006.01)
*C23C 14/54*     (2006.01)
(Continued)

(52) U.S. Cl.
CPC ...... *H01J 37/32495* (2013.01); *C23C 14/545* (2013.01); *C23C 16/52* (2013.01); *H01J 37/32715* (2013.01); *H01J 37/32899* (2013.01); *H01L 21/02274* (2013.01); *H01L 21/0332* (2013.01); *H01L 22/26* (2013.01);
(Continued)

(58) Field of Classification Search
CPC ..... C23C 14/541; C23C 14/545; C23C 16/46; C23C 16/52; C23C 16/4586; C23C 16/4581; H01J 2237/3321; H01J 2237/3323; H01J 37/32495; H01J 37/32715; H01J 37/32899; H01J 37/32477; H01J 2237/332; H01L 21/02274; H01L 21/0332; H01L 22/12; H01L 22/26; H01L 21/6719; H01L 21/67167; H01L 21/67115; H01L 21/6875; H05B 6/40
See application file for complete search history.

(56) References Cited

U.S. PATENT DOCUMENTS

| 2015/0001391 A1* | 1/2015 | Blake | ...................... C23C 14/22 |
| | | | 250/288 |
| 2016/0343545 A1* | 11/2016 | Blake | ...................... C23C 14/22 |

(Continued)

FOREIGN PATENT DOCUMENTS

| JP | 2004228564 A | * 8/2004 | .......... F27B 17/0025 |
| TW | 201349377 A | 12/2013 | |

(Continued)

OTHER PUBLICATIONS

International Search Report and Written Opinion mailed on Sep. 15, 2022 in International Patent Application No. PCT/US2022/029172, 11 pages.

*Primary Examiner* — Edward Chin
(74) *Attorney, Agent, or Firm* — Kilpatrick Townsend & Stockton LLP

(57) ABSTRACT

Exemplary semiconductor processing systems may include a chamber body having sidewalls and a base. The semiconductor processing systems may include a substrate support extending through the base of the chamber body. The substrate support may include a support plate. The substrates support may include a shaft coupled with the support plate. The semiconductor processing systems may include a liner positioned within the chamber body and positioned radially outward of a peripheral edge of the support plate. An inner surface of the liner may include an emissivity texture.

19 Claims, 6 Drawing Sheets

(51) Int. Cl.
*C23C 16/52* (2006.01)
*H01L 21/02* (2006.01)
*H01L 21/033* (2006.01)
*H01L 21/66* (2006.01)

(52) U.S. Cl.
CPC ............... *H01J 2237/3321* (2013.01); *H01J 2237/3323* (2013.01)

(56) References Cited

U.S. PATENT DOCUMENTS

| | | | | |
|---|---|---|---|---|
| 2018/0000412 | A1* | 1/2018 | Knickerbocker | H01L 24/69 |
| 2018/0023214 | A1* | 1/2018 | Lau | C23C 16/46 |
| | | | | 117/88 |
| 2019/0062904 | A1* | 2/2019 | Hawrylchak | C23C 16/0227 |
| 2021/0366722 | A1* | 11/2021 | Lei | H01L 21/31116 |

FOREIGN PATENT DOCUMENTS

| | | | | |
|---|---|---|---|---|
| TW | 202137372 A | * | 10/2021 | ......... C23C 16/4581 |
| WO | 00-34986 A1 | | 6/2000 | |

* cited by examiner

METHOD TO IMPROVE WAFER EDGE UNIFORMITY

TECHNICAL FIELD

The present technology relates to components and apparatuses for semiconductor manufacturing. More specifically, the present technology relates to processing chamber components and other semiconductor processing equipment.

BACKGROUND

Integrated circuits are made possible by processes which produce intricately patterned material layers on substrate surfaces. Producing patterned material on a substrate requires controlled methods for forming and removing material. Precursors are often delivered to a processing region and distributed to uniformly deposit or etch material on the substrate. Many aspects of a processing chamber may impact process uniformity, such as uniformity of process conditions within a chamber, uniformity of flow through components, as well as other process and component parameters. Even minor discrepancies across a substrate may impact the formation or removal process.

Thus, there is a need for improved systems and methods that can be used to produce high quality devices and structures. These and other needs are addressed by the present technology.

SUMMARY

Exemplary semiconductor processing systems may include a chamber body having sidewalls and a base. The semiconductor processing systems may include a substrate support extending through the base of the chamber body. The substrate support may include a support plate. The substrate support may include a shaft coupled with the support plate. The semiconductor processing systems may include a liner positioned within the chamber body and positioned radially outward of a peripheral edge of the support plate. An inner surface of the liner may include an emissivity texture.

In some embodiments, the emissivity texture may include a plurality of microstructures. The emissivity texture may include a plurality of nanostructures. The emissivity texture may include a laser-textured pattern. The emissivity texture may be substantially uniform about an entire circumference of the liner. The emissivity texture may extend about only a portion of a circumference of the liner. The emissivity texture may include a variable emissivity level about a circumference of the liner. The liner may be a pumping liner. The emissivity texture may extend from a bottom height that is proximate a bottom edge of the support plate to a top height that is above a top edge of the support plate. The emissivity texture may include a plurality of dimples formed in the inner surface of the liner.

Some embodiments of the present technology may encompass semiconductor processing systems. The systems may include a chamber body having sidewalls and a base. The systems may include a substrate support extending through the base of the chamber body. The substrate support may include a support plate. The substrate support may include a shaft coupled with the support plate. The systems may include a liner positioned within the chamber body and positioned radially outward of a peripheral edge of the support plate. At least a portion of an inner surface of the liner may include an emissivity texture. The emissivity texture may include a plurality of dimples formed in the at least a portion of the inner surface of the liner.

In some embodiments, the emissivity texture may include a first emissivity region and a second emissivity region. The first emissivity region may include a greater dimple density than the second emissivity region. The emissivity texture may include a first emissivity region and a second emissivity region. The first emissivity region may include larger dimples than the second emissivity region. Each of the plurality of dimples may have a diameter of less than about 50 microns. An emissivity level of the emissivity texture is between about 0.05 and 0.95. Each of the plurality of dimples may have a depth of less than about 50 microns.

Some embodiments of the present technology may encompass methods of reducing film thickness non-uniformity of a substrate. The methods may include performing a film deposition operation on a first substrate. The methods may include determining a first film thickness profile proximate a peripheral edge of the first substrate. The methods may include positioning a second substrate atop a substrate support within a substrate processing chamber. The substrate processing chamber may include a liner that is positioned radially outward of a peripheral edge of the substrate support. The liner may include an emissivity texture. The methods may include performing a film deposition operation on the second substrate. The methods may include determining a second film thickness profile proximate a peripheral edge of the second substrate. The methods may include generating an updated emissivity pattern based on the first film thickness profile and the second film thickness profile.

In some embodiments, generating the updated emissivity pattern may include determining a difference between the first film thickness profile and the second film thickness profile. Generating the updated emissivity pattern may include determining a relationship between an emissivity level of the emissivity texture and the difference between the first film thickness profile and the second film thickness profile. Generating the updated emissivity pattern may include adjusting one or more regions of the emissivity pattern based on one or both of the first film thickness profile and the second film thickness profile. Generating the updated emissivity pattern may include adjusting one or more regions of the emissivity pattern based on the relationship between the emissivity level of the emissivity pattern and the difference between the first film thickness profile and the second film thickness profile. Each of the one or more regions may include an arc-shaped segment of an inner surface of the liner. The methods may include positioning a second liner within the substrate processing chamber. The second liner may include the updated emissivity texture. The methods may include performing a deposition operation on a subsequent substrate within the substrate processing chamber.

Such technology may provide numerous benefits over conventional systems and techniques. For example, embodiments of the present technology may improve temperature uniformity and film uniformity across a substrate. In particular, film thickness uniformity may be improved at peripheral edges of the substrate. Additionally, the components may allow modification to accommodate any number of chambers or processes. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
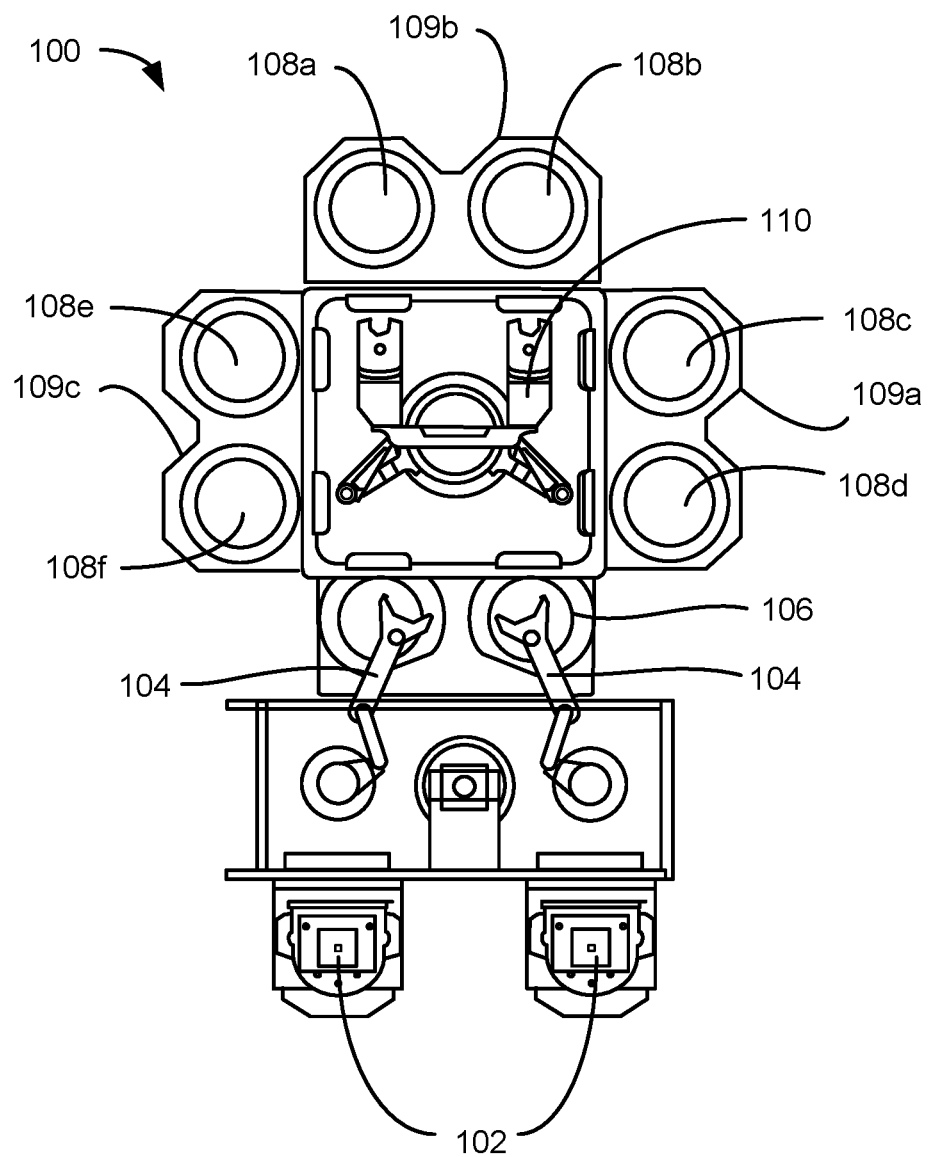
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Plasma enhanced deposition processes may energize one or more constituent precursors to facilitate film formation on a substrate. Any number of material films may be produced to develop semiconductor structures, including conductive and dielectric films, as well as films to facilitate transfer and removal of materials. For example, hardmask films may be formed to facilitate patterning of a substrate, while protecting the underlying materials to be otherwise maintained. In many processing chambers, a number of precursors may be mixed in a gas panel and delivered to a processing region of a chamber where a substrate may be disposed. While components of the lid stack may impact flow distribution into the processing chamber, many other process variables may similarly impact uniformity of deposition.

As device features reduce in size, tolerances across a substrate surface may be reduced, and material property differences across a film may affect device realization and uniformity. Many chambers include a characteristic process signature, which may produce residual non-uniformity across a substrate. Temperature differences, flow pattern uniformity, and other aspects of processing may impact the films on the substrate, creating film uniformity differences across the substrate for materials produced or removed. For example, turbulent deposition gas flow and/or misalignment of apertures of a blocker plate and faceplate of a gas box may lead to non-uniform flow of deposition gases. In some instances, the blocker plate may not uniformly distribute flow of precursors to edge regions of a substrate. Additionally, in some embodiments a substrate support or heater on which a substrate is disposed may include one or more heating mechanisms to heat a substrate. When heat is delivered or lost differently between regions of a substrate, the film deposition may be impacted where, for example, warmer portions of the substrate may be characterized by thicker deposition or different film properties relative to cooler portions. This temperature non-uniformity may be attributable, for example, to temperature fluctuations about the shaft of the pedestal and may particularly affect edge regions of substrates.

The present technology overcomes these challenges during these higher temperature processes, as well as for any other process that may benefit from improved temperature uniformity. For example, embodiments of the present technology may utilize a liner having one or more regions of different emissivity levels that correspond to areas or high and/or low film thickness at peripheral regions of the substrate. The use of such liners may provide increased control of heat loss within any particular chamber and greater film thickness uniformity across the peripheral edge may be achieved. Accordingly, the present technology may produce improved film deposition characterized by improved thickness and material property uniformity across a surface of the substrate.

Although the remaining disclosure will routinely identify specific deposition processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include lid stack components according to embodiments of the present technology before additional variations and adjustments to this system according to embodiments of the present technology are described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including formation of stacks of semiconductor materials described herein in addition to plasma-enhanced chemical vapor deposition, atomic layer deposition, physical vapor deposition, etch, pre-clean, degas, orientation, and other substrate processes including, annealing, ashing, etc.

The substrate processing chambers 108a-f may include one or more system components for depositing, annealing, curing and/or etching a dielectric or other film on the substrate. In one configuration, two pairs of the processing chambers, e.g., 108c-d and 108e-f, may be used to deposit dielectric material on the substrate, and the third pair of processing chambers, e.g., 108a-b, may be used to etch the deposited dielectric. In another configuration, all three pairs of chambers, e.g., 108a-f, may be configured to deposit stacks of alternating dielectric films on the substrate. Any one or more of the processes described may be carried out in chambers separated from the fabrication system shown in different embodiments. It will be appreciated that additional configurations of deposition, etching, annealing, and curing chambers for dielectric films are contemplated by system 100.

Figure 2:
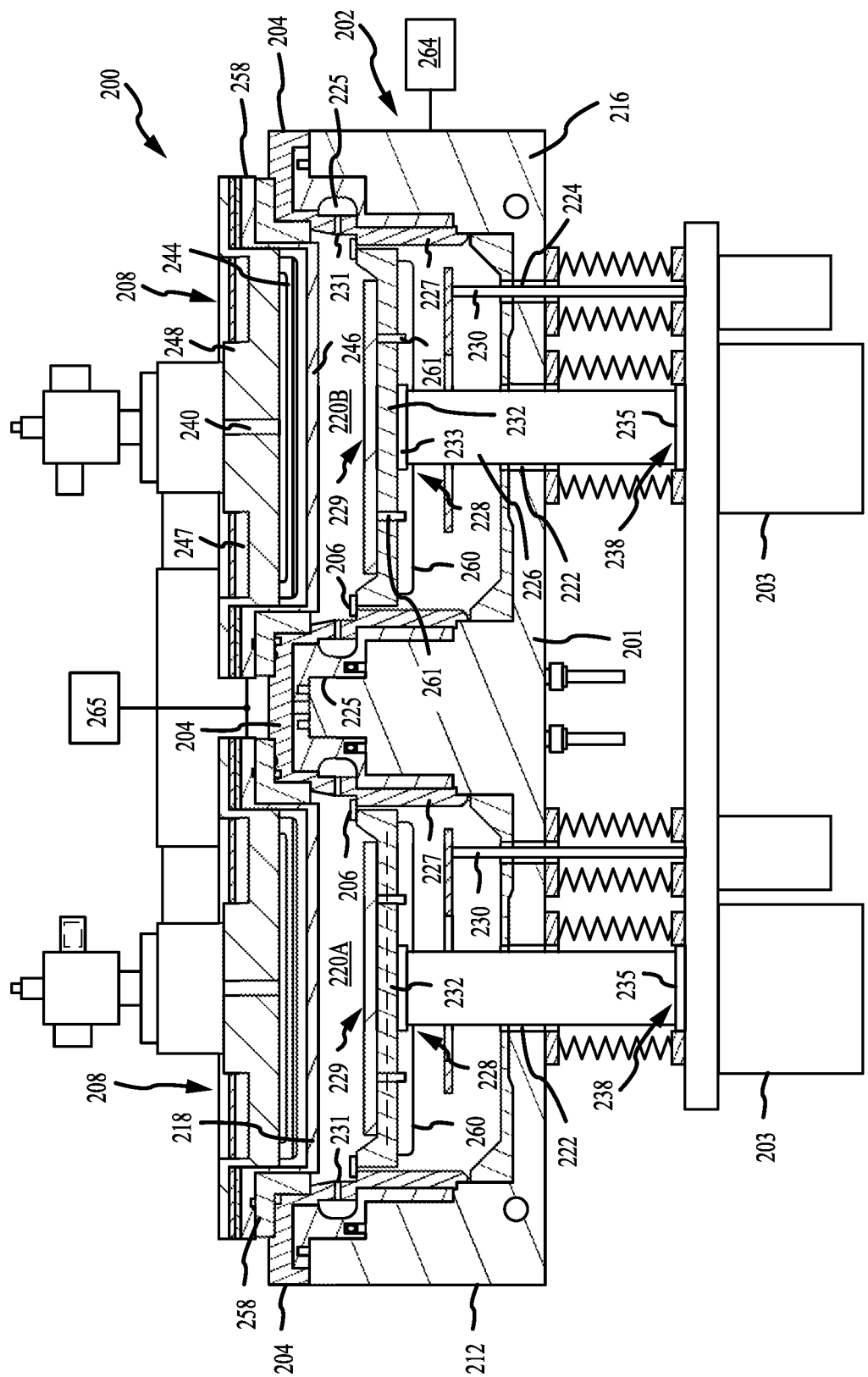
FIG. 2 shows a schematic cross-sectional view of an exemplary plasma system according to some embodiments of the present technology.

FIG. 2 shows a schematic cross-sectional view of an exemplary plasma system 200 according to some embodiments of the present technology. Plasma system 200 may illustrate a pair of processing chambers 108 that may be fitted in one or more of tandem sections 109 described above, and which may include faceplates or other components or assemblies according to embodiments of the present technology. The plasma system 200 generally may include a chamber body 202 having sidewalls 212, a bottom wall 216, and an interior sidewall 201 defining a pair of processing regions 220A and 220B. Each of the processing regions 220A-220B may be similarly configured, and may include identical components.

For example, processing region 220B, the components of which may also be included in processing region 220A, may include a pedestal 228 disposed in the processing region through a passage 222 formed in the bottom wall 216 in the plasma system 200. The pedestal 228 may provide a heater adapted to support a substrate 229 on an exposed surface of the pedestal, such as a body portion. The pedestal 228 may include heating elements 232, for example resistive heating elements, which may heat and control the substrate temperature at a desired process temperature. Pedestal 228 may also be heated by a remote heating element, such as a lamp assembly, or any other heating device.

The body of pedestal 228 may be coupled by a flange 233 to a stem 226. The stem 226 may electrically couple the pedestal 228 with a power outlet or power box 203. The power box 203 may include a drive system that controls the elevation and movement of the pedestal 228 within the processing region 220B. The stem 226 may also include electrical power interfaces to provide electrical power to the pedestal 228. The power box 203 may also include interfaces for electrical power and temperature indicators, such as a thermocouple interface. The stem 226 may include a base assembly 238 adapted to detachably couple with the power box 203. A circumferential ring 235 is shown above the power box 203. In some embodiments, the circumferential ring 235 may be a shoulder adapted as a mechanical stop or land configured to provide a mechanical interface between the base assembly 238 and the upper surface of the power box 203.

A rod 230 may be included through a passage 224 formed in the bottom wall 216 of the processing region 220B and may be utilized to position substrate lift pins 261 disposed through the body of pedestal 228. The substrate lift pins 261 may selectively space the substrate 229 from the pedestal to facilitate exchange of the substrate 229 with a robot utilized for transferring the substrate 229 into and out of the processing region 220B through a substrate transfer port 260.

A chamber lid 204 may be coupled with a top portion of the chamber body 202. The lid 204 may accommodate one or more precursor distribution systems 208 coupled thereto. The precursor distribution system 208 may include a precursor inlet passage 240 which may deliver reactant and cleaning precursors through a gas delivery assembly 218 into the processing region 220B. The gas delivery assembly 218 may include a gasbox 248 having a blocker plate 244 disposed intermediate to a faceplate 246. A radio frequency ("RF") source 265 may be coupled with the gas delivery assembly 218, which may power the gas delivery assembly 218 to facilitate generating a plasma region between the faceplate 246 of the gas delivery assembly 218 and the pedestal 228, which may be the processing region of the chamber. In some embodiments, the RF source may be coupled with other portions of the chamber body 202, such as the pedestal 228, to facilitate plasma generation. A dielectric isolator 258 may be disposed between the lid 204 and the gas delivery assembly 218 to prevent conducting RF power to the lid 204. A shadow ring 206 may be disposed on the periphery of the pedestal 228 that engages the pedestal 228.

An optional cooling channel 247 may be formed in the gasbox 248 of the gas distribution system 208 to cool the gasbox 248 during operation. A heat transfer fluid, such as water, ethylene glycol, a gas, or the like, may be circulated through the cooling channel 247 such that the gasbox 248 may be maintained at a predefined temperature. A liner assembly 227 may be disposed within the processing region 220B in close proximity to the sidewalls 201, 212 of the chamber body 202 to prevent exposure of the sidewalls 201, 212 to the processing environment within the processing region 220B. The liner assembly 227 may include a circumferential pumping cavity 225, which may be coupled to a pumping system 264 configured to exhaust gases and byproducts from the processing region 220B and control the pressure within the processing region 220B. A plurality of exhaust ports 231 may be formed on the liner assembly 227. The exhaust ports 231 may be configured to allow the flow of gases from the processing region 220B to the circumferential pumping cavity 225 in a manner that promotes processing within the system 200.

Figure 3:
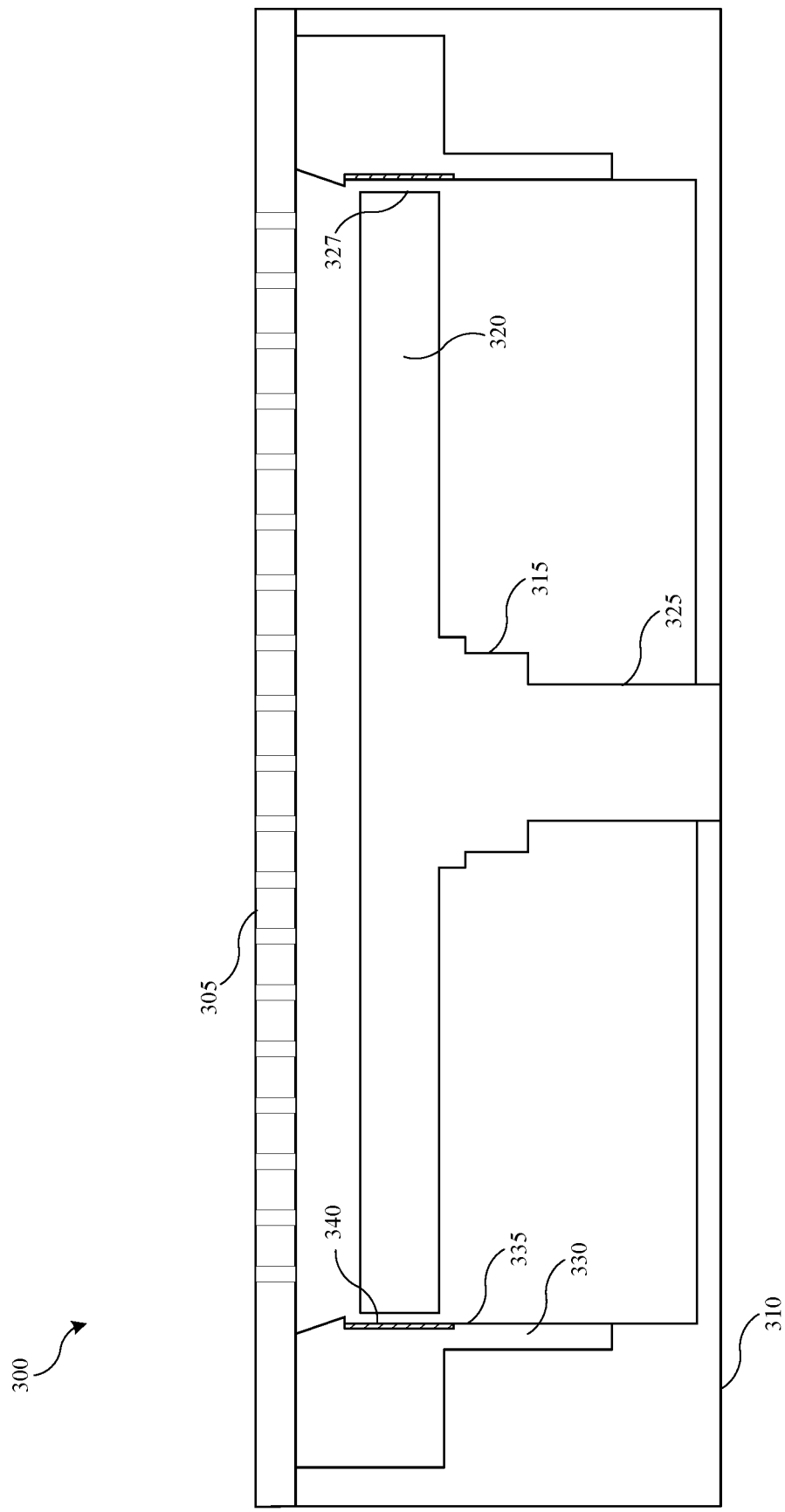
FIG. 3 shows a schematic cross-sectional view of an exemplary processing chamber according to some embodiments of the present technology.

FIG. 3 shows a schematic partial cross-sectional view of an exemplary processing system 300 according to some embodiments of the present technology. FIG. 3 may illustrate further details relating to components in system 200, such as for pedestal 228. System 300 is understood to include any feature or aspect of system 200 discussed previously in some embodiments. The system 300 may be used to perform semiconductor processing operations including deposition of hardmask materials as previously described, as well as other deposition, removal, and cleaning operations. System 300 may show a partial view of the chamber components being discussed and that may be incorporated in a semiconductor processing system. Any aspect of system 300 may also be incorporated with other processing chambers or systems as will be readily understood by the skilled artisan.

System 300 may include a processing chamber including a faceplate 305, through which precursors may be delivered for processing, and which may be coupled with a power source for generating a plasma within the processing region of the chamber. The chamber may also include a chamber body 310, which as illustrated may include sidewalls and a base. A pedestal or substrate support 315 may extend through the base of the chamber as previously discussed. The substrate support may include a support plate 320, which may support semiconductor substrate 322. The support plate 320 may be coupled with a shaft 325, which may extend through the base of the chamber.

As previously explained, thermal uniformity may be challenged in any processing chamber, and for higher temperature processes, radiative losses may be substantially greater. Continuing the non-limiting example explained previously, some carbon-film deposition may be performed at temperatures above 600° C., or higher, which may facilitate adsorption of carbon radicals on a surface of the substrate. To maintain these processing temperatures, the substrate support, such as substrate support 315, may include one or more heating elements, which may be enabled to produce substrate or plate temperatures that may be greater than or about 500° C., and may be greater than or about 525° C., greater than or about 550° C., greater than or about 575° C., greater than or about 600° C., greater than or about 625° C., greater than or about 650° C., greater than or about 675° C., greater than or about 700° C., greater than or about 725° C., greater than or about 750° C., greater than or about 775° C., greater than or about 800° C., or higher.

While the semiconductor substrate 322 and aspects of the support may be maintained at higher temperatures, the chamber body 310 may be maintained at lower temperatures, such as below or about 100° C. or lower. This may create a heat sink that can affect the temperature profile across the substrate 322. For example, edge regions of the substrate 322 or support plate 320 may have higher losses to the sidewalls of the chamber, which may lower a substrate temperature radially about the substrate 322. This lower temperature in a radial band may produce a first kind of non-uniformity, which may exist in a band about the substrate 322. Similarly, as illustrated in the figure, a slit valve or chamber access may be positioned or defined through a portion of the chamber body. This access may be characterized by a lower temperature than other aspects of the chamber body, which may create a localized heat sink. This lower temperature in a region may create a planar non-uniformity, where a section of substrate 322 may be characterized by lower temperature.

Temperature at the substrate 322 may be closely correlated to the extinction coefficient of the film, accordingly, temperature fluctuations across the film, which may result in thickness variations, may also result in extinction coefficient variation across the film, which may impact subsequent lithography or etching operations.

System 300 may include a liner 330, which may extend about the peripheral edge of the substrate support 315. For example, the liner 330 may be positioned between about 1 mm and about 10 mm radially outward from a peripheral edge 327 of the support plate 320. The liner 330 may extend from height that is proximate a bottom edge of the support plate 320 (or lower) to a height that is above a top edge and/or top surface of the support plate 320. In some embodiments, the liner 330 may be a pumping liner, similar to liner assembly 227 described above. In other embodiments, the liner 330 may be a separate liner that is disposed within the chamber body 310. Liner 330 may be formed of a conductive material, such as aluminum or other metal in some embodiments. In other embodiments, the liner 330 may be formed from a ceramic and/or other dielectric material, such as aluminum nitride.

An inner surface 335 of the liner 330 may include at least one emissivity texture 340. The emissivity texture 340 may include a number of structures formed in the inner surface 335 that provide surface roughness that may be used to adjust an emissivity level of the inner surface 335 of the liner 330 at a given angular position. For example, the structures may include a number of dimples, apertures, grooves, pillars, protrusions, free forms, and/or other features that alter the emissivity level of the liner 330 at the positions of the structures. The structures may be microstructures and/or nanostructures. For example, each structure forming the emissivity texture 340 may have dimensions (depth, width, length, etc.) that are on the micro and/or nano scale. In some embodiments, dimensions of each structure may be less than or about 100 microns, less than or about 75 microns, less than or about 50 microns, less than or about 25 microns, less than or about 10 microns, less than or about 5 microns, less than or about 1 micron, less than or about 500 nm, less than or about 400 nm, less than or about 300 nm, less than or about 200 nm, less than or about 100 nm, less than or about 50 nm, less than or about 25 nm, or less. One or more of the dimensions of each structure may be approximately the same size and/or may be different in various embodiments. An area density of the structures (an amount of surface area covered by the structures) within a given region of the inner surface 335 may be between or about 1% and 95%. The liner 330 may include one or more regions of different area densities. For example, the liner 330 may include greater than or about 1 region, greater than or about 2 regions, greater than or about 3 regions, greater than or about 4 regions, greater than or about 5 regions, greater than or about 6 regions, greater than or about 7 regions, greater than or about 8 regions, greater than or about 9 regions, greater than or about 10 regions, or more. In a particular embodiment, the inner surface 335 may include one or more high density regions that include area densities of between or about 70% and 95%, between or about 75% and 90%, or between or about 80% and 85%. The inner surface 335 may include one or more medium density regions that include area densities of between or about 35% and 70%, between or about 40% and 65%, between or about 45% and 60%, or between or about 50% and 55%. The inner surface 335 may include one or more low density regions that have area densities of between or about 1% and 35%, between or about 5% and 30%, between or about 10% and 25%, or between or about 15% and 20%.

Oftentimes, the emissivity texture 340 may be formed using laser-texturing, however other forms of surface texturing, such as bead blasting may be utilized. The use of laser-texturing may enable the emissivity texture to be applied in a very precise manner, which may enable the emissivity level to be precisely tuned at various locations on the inner surface 335. The emissivity levels may be used to control how much heat is reflected from the liner 330 back to the substrate 322. The amount of reflected heat may directly impact the deposition rate of film on the substrate 322, particularly in areas proximate the peripheral edge of the substrate 322 (closest to the liner 330). The tuning of emissivity levels at one or more regions of the liner 330 may therefore enable the film thickness at peripheral edges of the substrate 322 to be carefully controlled during deposition operations.

The emissivity level of the inner surface 335 may be tuned by adjusting a size and/or density of the structures within the emissivity texture 340. For example, the emissivity level may be increased by utilizing larger structures and/or increasing the density of structures within a given region of the inner surface 335. Using smaller structures and/or a lower density of structures may reduce the emissivity level. A lowest emissivity level may be achieved by omitting structures in a given region of the inner surface 335, leaving the inner surface 335 in that region with a relatively smooth and/or polished finished. Typically, the emissivity level of the inner surface 335 may range between about 0.05 and 0.95, between or about 0.15 and 0.85, between or about 0.25 and 0.75, between or about 0.35 and 0.65, or between or about 0.45 and 0.55, depending on the material of the liner 330 and the size and/or density of structures forming the emissivity pattern 340.

In some embodiments, the emissivity texture 340 on the inner surface 335 may be generally uniform across a circumference of the liner 330. As used herein, generally uniform may understood to mean that the structure size and/or area density is uniform to within or about 20%, within or about 10%, within or about 5%, within or about 3%, within or about 2%, within or about 1%, or less. In other embodiments, the emissivity texture 340 may include multiple regions that include different emissivity levels to reflect different amounts of heat back to the support plate 320 at various angular positions. The various regions of the liner 330 (each with a respective emissivity level) may be sized, shaped, and positioned to control the temperature of the edge region of the semiconductor substrate 322 to improve temperature uniformity and/or otherwise reduce residual non-uniformity on the semiconductor substrate 322.

Figure 4A:
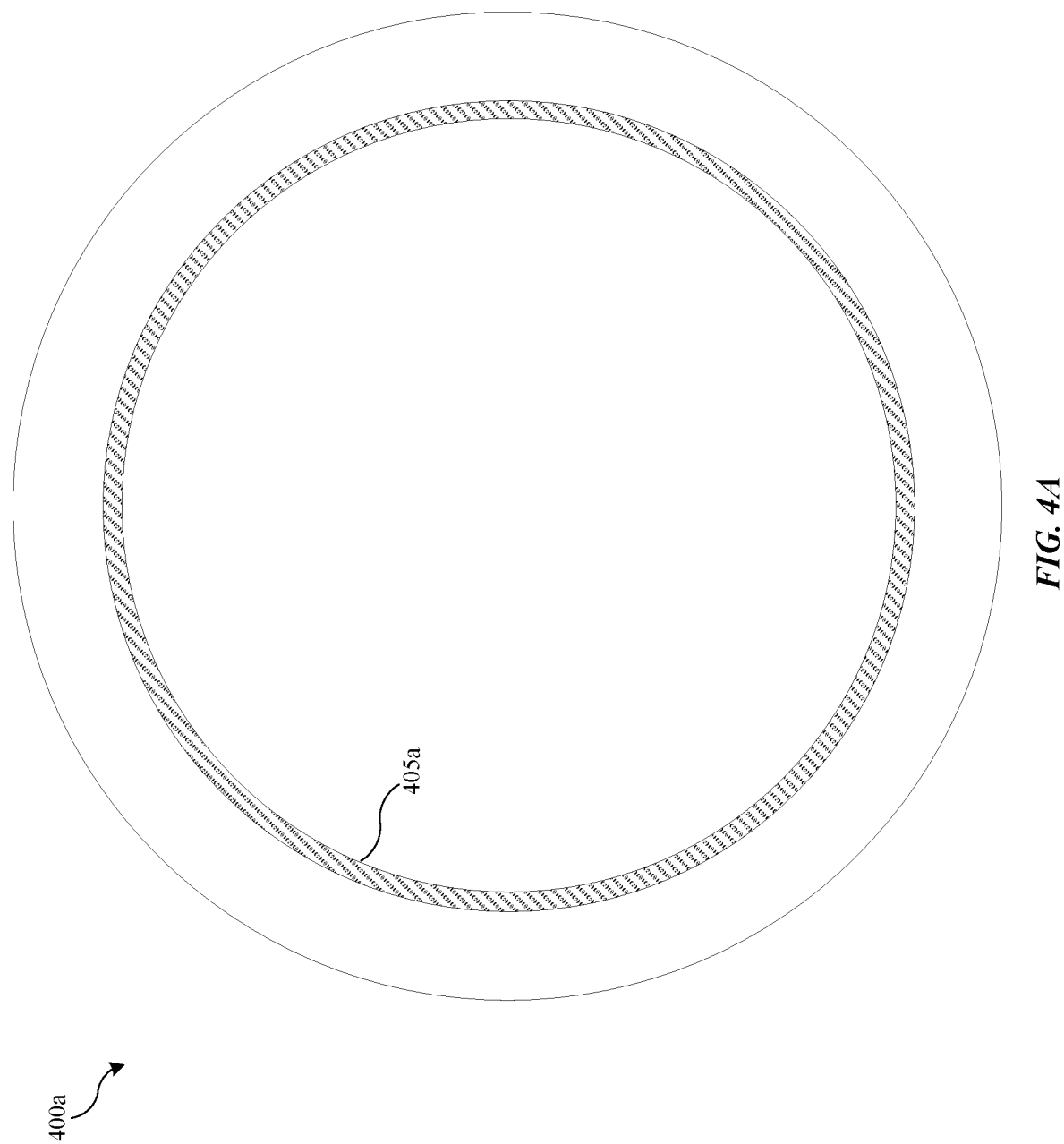
FIG. 4A shows a schematic top plan view of a liner according to some embodiments of the present technology.
Figure 4B:
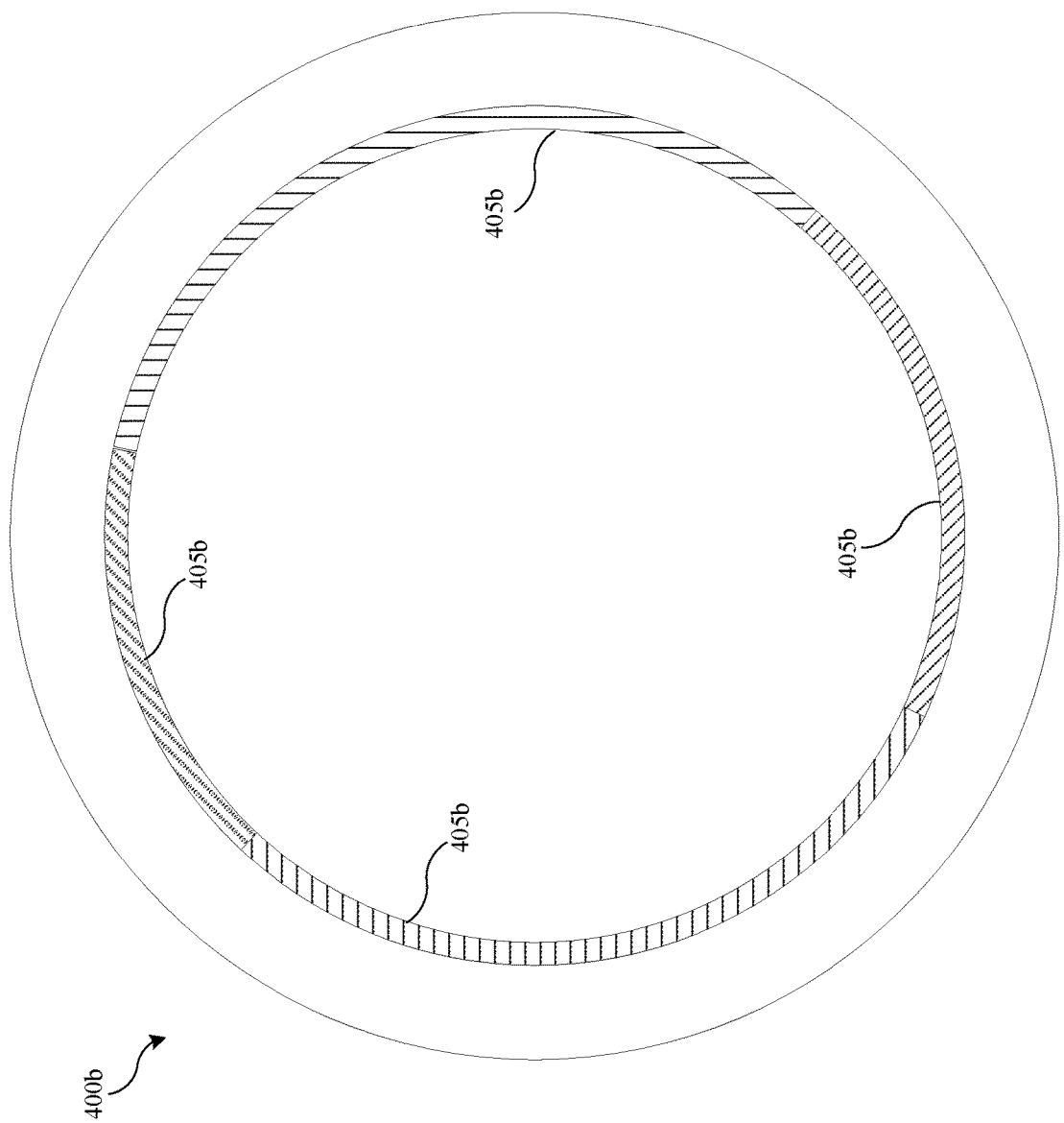
FIG. 4B shows a schematic top plan view of a liner according to some embodiments of the present technology.

FIGS. 4 and 4B shows a schematic top plan view of exemplary liners 400 according to some embodiments of the present technology. The liners 400 may be included in any chamber or system previously described (such as system 200 or 300), as well as any other chamber or system that may benefit from emissivity texturing. The liners 400 may be used as liner 330 described above. When processing semiconductor substrates with a fixed recipe, a film residue pattern should be stable substrate to substrate. With a known residue pattern, the liners 400 may include a number of regions 405 having emissivity levels that correspond to the known residue pattern in order to improve the uniformity of residue at the peripheral edge of the semiconductor substrate. For example, a residue map of the residue deposition on the peripheral edge of the semiconductor substrates processed with the fixed recipe may indicate sizes and locations of areas of low and high film deposition on the substrates. The liner 400 may include corresponding regions 405 with emissivity levels that are designed to raise deposition in low areas and/or to lower deposition in high areas to achieve better deposition uniformity across a semiconductor substrate. The emissivity level of each region 405 may be controlled using an emissivity texture formed from an array of microstructures and/or nanostructures, such as dimples, apertures, grooves, pillars, protrusions, free forms, and/or other features that alter the emissivity level of a particular region 405.

For example, regions 405 with low emissivity levels and/or high emissivity levels may be provided on the liners 400 in areas that correspond with areas in which the residue map indicated non-uniformity (high and/or low film thickness) of the film residue on the semiconductor substrate to reflect different amounts of heat back to the support plate, which raises and/or lowers the temperature of the semiconductor substrate in desired areas to even out the deposition film. The temperature changes to the semiconductor substrate are typically about or greater than 0.5° C., about or greater than 1.0° C., about or greater than 1.5° C., about or greater than 2.0° C., about or greater than 2.5° C., about or greater than 3.0° C., about or greater than 3.5° C., about or greater than 4.0° C., about or greater than 4.5° C., or more, with the actual temperature change to the semiconductor substrate depending on a temperature of the heater. Higher temperature processes may have greater radiative heat losses that can be reflected back using liners 400.

In some embodiments, a liner 400a may include a single region 405a as shown in FIG. 4A. The region 405a may have an emissivity level that is selected to uniformly alter the deposition (i.e., increase or decrease a film thickness) at the peripheral edge of the substrate. For example, the size and/or density of dimples and/or other structures provided within the region 405a may be generally uniform about a circumference of the liner 400a. In other embodiments, a liner 400b may include a number of regions 405b as shown in FIG. 4B. Each region 405b may be arc-shaped, with any emissivity texture extending vertically along all or a portion of a height of the liner 400b. The emissivity texture within a given region 405b may extend from a height that is below a top surface of a substrate support to a height that is above than the top surface of the substrate support. For example, the emissivity texture may begin at a height that is below a midpoint of a support plate of the substrate support. The emissivity texture may between at a position proximate a bottom edge of the support plate in some embodiments. For example, the emissivity texture may begin at a height that is within or about 25 mm of the bottom edge, within or about 20 mm of the bottom edge, within or about 15 mm of the bottom edge, within or about 10 mm of the bottom edge, within or about 5 mm of the bottom edge, within or about 3 mm of the bottom edge, within or about 2 mm of the bottom edge, within or about 1 mm of the bottom edge, or less. In a particular embodiment, a lower edge of an emissivity texture may be substantially aligned with the bottom edge of the support plate. The emissivity texture may extend upward on the liner 400b to a position that is level with and/or elevated relative to a top surface of the support plate. For example, the emissivity texture may extend to a height that is substantially aligned with a top surface of the support plate, greater than or about 0.5 mm above the top surface, greater than or about 1.0 mm above the top surface, greater than or about 1.5 mm above the top surface, greater than or about 2.0 mm above the top surface, greater than or about 2.5 mm above the top surface, or greater.

While shown with four regions 405b, it will be appreciated that liner 400b may include any number of regions 405b. For example, the liner 400b may include greater than or about 1 region 405b, greater than or about 2 regions 405b, greater than or about 3 regions 405b, greater than or about 4 regions 405b, greater than or about 5 regions 405b, greater than or about 6 regions 405b, greater than or about 7 regions 405b, greater than or about 8 regions 405b, greater than or about 9 regions 405b, greater than or about 10 regions 405b, or more. At least some of the regions 405b may have different emissivity levels, and in some embodiments each region 405b may have unique emissivity level. In some embodiments, one or more of the regions 405b may have no emissivity texture, with the emissivity level of the respective region 405b matching that of the un-textured material forming the liner 400b. Each region 405b may be sized and positioned to correspond to areas of high and/or low film deposition. As illustrated, the transitions between adjacent regions 405b may be abrupt, with each adjacent region 405b having distinct structure size and/or density to create different emissivity levels. In other embodiments, transitions between adjacent regions 405b may be graduated such that it may be difficult to discern an exact boundary between the regions 405b. For example, the an area density of one region 405b may be about 60% and an area density of an adjacent region may be 30%. In some embodiments, the area density may abruptly change from 60% to 30% at the boundary between the regions 405b. In other embodiments, within an angular range on one or both sides of the boundary, the area density may gradually change from 60% from 30% with one or more intermediate area densities at any level of granularity (e.g., 1% increments, 5% increments, 10% increments, etc.) in between. In some embodiments, all of the inner surface of the liner 400b may include a gradual change in emissivity level, area density, and/or structure size to accommodate more complex film non-uniformity profiles.

As illustrated, liner 400b includes four regions 405b that each have a unique emissivity level. The emissivity levels may be characterized as being low emissivity regions (e.g., emissivity level of less than or about 0.4), high emissivity regions (e.g., emissivity level of greater than or about 0.6), and/or moderate emissivity regions (emissivity level of between or about 0.4 and 0.6). The low emissivity regions may be placed in areas of the liner 400b that correspond to areas of the semiconductor substrate that have thinner film deposition. The low emissivity regions may reflect greater levels of heat back to the support plate and the semiconductor substrate to increase deposition rate during processing, and may help increase film deposition at these areas. High emissivity regions may be placed in areas of the liner 400b that correspond to areas of the semiconductor substrate that have thicker film deposition. These high emissivity regions may absorb greater levels of heat to help decrease film deposition at these areas. As noted above, the emissivity levels of the various emissivity regions may be achieved by adjusting a size and/or area density of micro and/or nano structures that form an emissivity texture within the given region. The size, position, emissivity, and/or number of regions 405b may be selected to meet a particular film deposition map for a given recipe to create a more uniform film deposition on a given semiconductor substrate.

While described in terms such as "high" emissivity and "low" emissivity, a person of skill in the art will understand that the high emissivity regions may not have a particular emissivity coefficient (i.e., over 0.60), but instead may be understood to have higher emissivity level than the low emissivity regions. Similarly, the low emissivity regions are not constrained to a particular emissivity coefficient range, but rather are defined relative to the emissivity level of other zones. In some embodiments, all regions 405b may have emissivity coefficients that are less than 0.40 or greater than 0.60. Any combination of low, moderate, and/or high emissivity regions may be provided on the liner 400b to generate more uniform plasma deposition at peripheral edges of a semiconductor substrate. In some embodiments, all of the emissivity regions of a given type (high or low) may have the same emissivity level. In other embodiments, some or all of the low emissivity regions may have different emissivity levels than other low emissivity regions. Similarly, some or all of the high emissivity regions may have different emissivity levels than other high emissivity regions.

Figure 5:
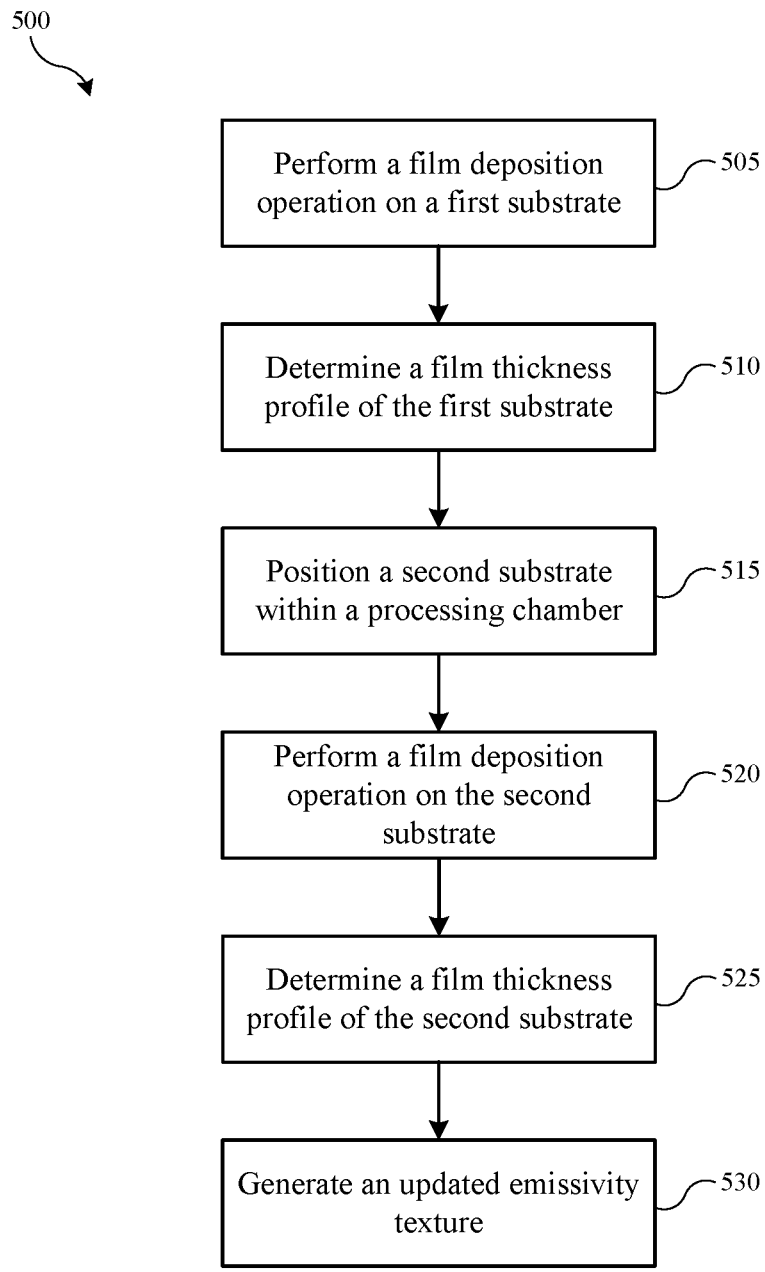
FIG. 5 shows operations of an exemplary method of reducing film thickness non-uniformity of a substrate according to some embodiments of the present technology.

FIG. 5 shows operations of an exemplary method 500 of reducing film thickness non-uniformity of a substrate according to some embodiments of the present technology. The method may be performed in a variety of processing chambers, including processing system 200 or 300 described above, which may include liners according to embodiments of the present technology, such as any liner discussed previously. Method 500 may include a number of optional operations, which may or may not be specifically associated with some embodiments of methods according to the present technology.

Method 500 may include a processing method that may include operations for forming a hardmask film or other deposition operations. The method may include optional operations prior to initiation of method 500, or the method may include additional operations. For example, method 500 may include operations performed in different orders than illustrated. Method 500 may include performing a film deposition operation on a first substrate at operation 505. In some embodiments, the film deposition operation may include flowing one or more precursors into a processing chamber. For example, the precursor may be flowed into a chamber, such as included in system 100, 200, or 300, and may flow the precursor through one or more of a gasbox, a blocker plate, or a faceplate, prior to delivering the precursor into a processing region of the chamber. In some embodiments the precursor may be or include a carbon-containing precursor. A plasma may be generated of the precursors within the processing region, such as by providing RF power to the faceplate to generate a plasma. Material formed in the plasma, such as a carbon-containing material, may be deposited on the substrate.

Method 500 may include determining a film thickness profile proximate a peripheral edge of the first substrate at operation 510. This may include determining a film thickness at various angular positions about the periphery of the substrate. Method 500 may include positioning a second substrate atop a substrate support within a substrate processing chamber at operation 515. The substrate processing chamber may be a same or a different chamber than the chamber used to process the first substrate. The chamber may include a liner that is positioned radially outward of a peripheral edge of the substrate support and may include an emissivity texture that covers all or part of an inner surface of the liner. For example, the liner may include one or more regions that include an arc-shaped segment of an inner surface of the liner. In single region embodiments, the single region may be arc-shaped and/or annular-shaped. Each region may have an emissivity level that may be tailored using an emissivity pattern formed from a number of micro and/or nano structures formed on the inner surface of the liner. The emissivity level may be adjusted by modifying the area density and/or size of the structures within a given region.

At operation 520, method 500 may include performing a film deposition operation on the second substrate. At operation 525, the method 500 may include determining a film thickness profile proximate a peripheral edge of the second substrate. The method 500 may include generating an updated emissivity texture based on the first film thickness profile and the second film thickness profile at operation 530. For example, generating the updated emissivity pattern may include determining a difference between the first film thickness profile and the second film thickness profile. For example, a film thickness in edge regions may change a certain number of angstroms (or other unit) from the first substrate to the second substrate. A relationship may be determined between an emissivity level of the emissivity texture and the difference between the first film thickness profile and the second film thickness profile. For example, the liner may have a generally uniform emissivity texture/level across the entire inner surface of the liner. The change in film thickness from the first substrate to the second substrate may be attributed to the emissivity level of the liner used in the deposition operation of the second substrate. This may enable a relationship between the emissivity level and the change in film thickness to be determined. In some embodiments, the relationship may be linear. For example, the relationship may show that for every increment of emissivity level in either direction (such as an increment in emissivity of 0.05) may result in a thickness of the film changing by a given thickness (such as one or more angstroms). This relationship may be used to produce a liner that may generate a uniform film thickness about the peripheral edge of subsequent substrates. For example, one or more regions of the emissivity texture may be adjusted based on 1) the first film thickness profile and/or the second film thickness profile and 2) the relationship between the emissivity level of the emissivity pattern and the difference between the first film thickness profile and the second film thickness profile. For example, emissivity level of regions of the liner design may be adjusted (such as by altering the size and/or area density of structures forming an emissivity texture) to correspond to areas that have low film thickness and areas that have high film thickness to attempt to make the film thickness more uniform. For example, an emissivity level in a first region may be increased to lower a film thickness by a set distance (based on the identified relationship between emissivity level and film thickness change) and an emissivity level in a second region may be decreased to increase a film thickness by a set distance.

The method 500 may optionally include positioning a second liner within the substrate processing chamber. The second liner may include the updated emissivity pattern. A deposition operation may be performed on a subsequent substrate within the chamber. The use of the second liner may generate a uniform film thickness about the peripheral edge of the substrate for substrates processed with a same chemistry. In some embodiments, the operations above may be repeated any number of times to generate a pattern of emissivity textures on the liner that successfully produces a desired film thickness profile about the peripheral edge of the substrate.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a region" includes a plurality of such regions, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A semiconductor processing system, comprising:
a chamber body comprising sidewalls and a base;
a substrate support extending through the base of the chamber body, wherein the substrate support comprises:
a support plate; and
a shaft coupled with the support plate; and
a liner positioned within the chamber body and positioned radially outward of a peripheral edge of the support plate, wherein:
an inner surface of the liner comprises an emissivity texture, wherein the emissivity texture comprises a laser-textured pattern, the laser-textured pattern comprising etched and non-etch portions of the inner surface of the liner.

2. The semiconductor processing system of claim 1, wherein:
the emissivity texture comprises a plurality of microstructures.

3. The semiconductor processing system of claim 1, wherein:
the emissivity texture comprises a plurality of nanostructures.

4. The semiconductor processing system of claim 1, wherein:
the emissivity texture is substantially uniform about an entire circumference of the liner.

5. The semiconductor processing system of claim 1, wherein:
the emissivity texture extends about only a portion of a circumference of the liner.

6. The semiconductor processing system of claim 1, wherein:
the emissivity texture comprises a variable emissivity level about a circumference of the liner.

7. The semiconductor processing system of claim 1, wherein:
the liner comprises a pumping liner.

8. The semiconductor processing system of claim 1, wherein:
the emissivity texture extends from a bottom height that is proximate a bottom edge of the support plate to a top height that is above a top edge of the support plate.

9. The semiconductor processing system of claim 1, wherein:
the emissivity texture comprises a plurality of dimples formed in the inner surface of the liner.

10. A semiconductor processing system, comprising:
a chamber body comprising sidewalls and a base;
a substrate support extending through the base of the chamber body, wherein the substrate support comprises:
a support plate; and
a shaft coupled with the support plate; and
a liner positioned within the chamber body and positioned radially outward of a peripheral edge of the support plate, wherein:
at least a portion of an inner surface of the liner comprises an emissivity texture, wherein the emissivity texture comprises a laser-textured pattern, the laser-textured pattern comprising etched and non-etch portions of the inner surface of the liner; and
the emissivity texture comprises a plurality of dimples formed in the at least a portion of the inner surface of the liner.

11. The semiconductor processing system of claim 10, wherein:
the emissivity texture comprises a first emissivity region and a second emissivity region; and
the first emissivity region comprises a greater dimple density than the second emissivity region.

12. The semiconductor processing system of claim 10, wherein:

the emissivity texture comprises a first emissivity region and a second emissivity region; and the first emissivity region comprises larger dimples than the second emissivity region.

13. The semiconductor processing system of claim 10, wherein:

each of the plurality of dimples has a diameter of less than about 50 microns.

14. The semiconductor processing system of claim 10, wherein:

an emissivity level of the emissivity texture is between about 0.05 and 0.95.

15. The semiconductor processing system of claim 10, wherein:

each of the plurality of dimples has a depth of less than about 50 microns.

16. A method of reducing film thickness non-uniformity of a substrate, comprising:

performing a film deposition operation on a first substrate;

determining a first film thickness profile proximate a peripheral edge of the first substrate;

positioning a second substrate atop a substrate support within a substrate processing chamber, wherein the substrate processing chamber comprises a liner that is positioned radially outward of a peripheral edge of the substrate support, the liner comprising an emissivity texture;

performing a film deposition operation on the second substrate;

determining a second film thickness profile proximate a peripheral edge of the second substrate; and generating an updated emissivity texture based on the first film thickness profile and the second film thickness profile.

17. The method of reducing film thickness non-uniformity of a substrate of claim 16, wherein:

generating the updated emissivity texture comprises:

determining a difference between the first film thickness profile and the second film thickness profile;

determining a relationship between an emissivity level of the emissivity texture and the difference between the first film thickness profile and the second film thickness profile; and adjusting one or more regions of the emissivity texture based on:

one or both of the first film thickness profile and the second film thickness profile; and the relationship between the emissivity level of the emissivity texture and the difference between the first film thickness profile and the second film thickness profile.

18. The method of reducing film thickness non-uniformity of a substrate of claim 17, wherein:

each of the one or more regions comprises an arc-shaped segment of an inner surface of the liner.

19. The method of reducing film thickness non-uniformity of a substrate of claim 16, further comprising:

positioning a second liner within the substrate processing chamber, wherein the second liner comprises the updated emissivity texture; and performing a deposition operation on a subsequent substrate within the substrate processing chamber.

\* \* \* \* \*